(12) United States Patent
Single et al.

(10) Patent No.: US 8,477,502 B2
(45) Date of Patent: Jul. 2, 2013

(54) ELECTRONIC MODULE

(75) Inventors: Ulrich Single, Penang (MY); Michael Maercker, Stuttgart (DE); Klaus Guenther, Stuttgart (DE); Martin Lohner, Bietigheim-Bissingen (DE); Klaus Dengler, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 154 days.

(21) Appl. No.: 13/059,960

(22) PCT Filed: Jul. 1, 2009

(86) PCT No.: PCT/EP2009/058273
§ 371 (c)(1),
(2), (4) Date: Mar. 22, 2011

(87) PCT Pub. No.: WO2010/020459
PCT Pub. Date: Feb. 25, 2010

(65) Prior Publication Data
US 2011/0170258 A1    Jul. 14, 2011

(30) Foreign Application Priority Data
Aug. 20, 2008    (DE) .................. 10 2008 041 366

(51) Int. Cl.
*H05K 7/20* (2006.01)
(52) U.S. Cl.
USPC ........... 361/720; 361/709; 361/715; 361/770; 363/141; 257/720
(58) Field of Classification Search
USPC ....... 361/676, 679.46, 679.54, 688, 701–705, 361/707, 709–711, 714–715, 717–722, 747, 361/752, 758, 760, 770
See application file for complete search history.

(56) References Cited

U.S. PATENT DOCUMENTS

| | | | | |
|---|---|---|---|---|
| 4,973,939 | A  * | 11/1990 | Lohner | 338/131 |
| 5,016,140 | A  * | 5/1991 | Prestel et al. | 361/781 |
| 5,738,177 | A  * | 4/1998 | Schell et al. | 173/178 |
| 5,946,192 | A | 8/1999 | Ishigami et al. | |
| 7,724,526 | B2 * | 5/2010 | Hinze et al. | 361/704 |
| 8,212,439 | B2 * | 7/2012 | Dautel et al. | 310/62 |
| 2001/0012212 | A1 * | 8/2001 | Ikeda | 363/141 |
| 2007/0079980 | A1 | 4/2007 | Kononenko et al. | |

FOREIGN PATENT DOCUMENTS

| | | |
|---|---|---|
| DE | 19719942 | 12/1998 |
| WO | 03017742 | 2/2003 |

OTHER PUBLICATIONS

International Search Report corresponding to PCT Application No. PCT/EP2009/058273, mailed Oct. 26, 2009 (German and English language document) (7 pages).

\* cited by examiner

*Primary Examiner* — Courtney Smith
(74) *Attorney, Agent, or Firm* — Maginot, Moore & Beck

(57) ABSTRACT

A portable power tool includes a tool housing, a motor unit located in the tool housing, and an electronic module located in the tool housing. The electronic module includes (i) an electronic module housing having at least one housing component, and (ii) at least one printed circuit board. The at least one printed circuit board is at least partially decoupled relative to the at least one housing component of the electronic module housing.

13 Claims, 3 Drawing Sheets

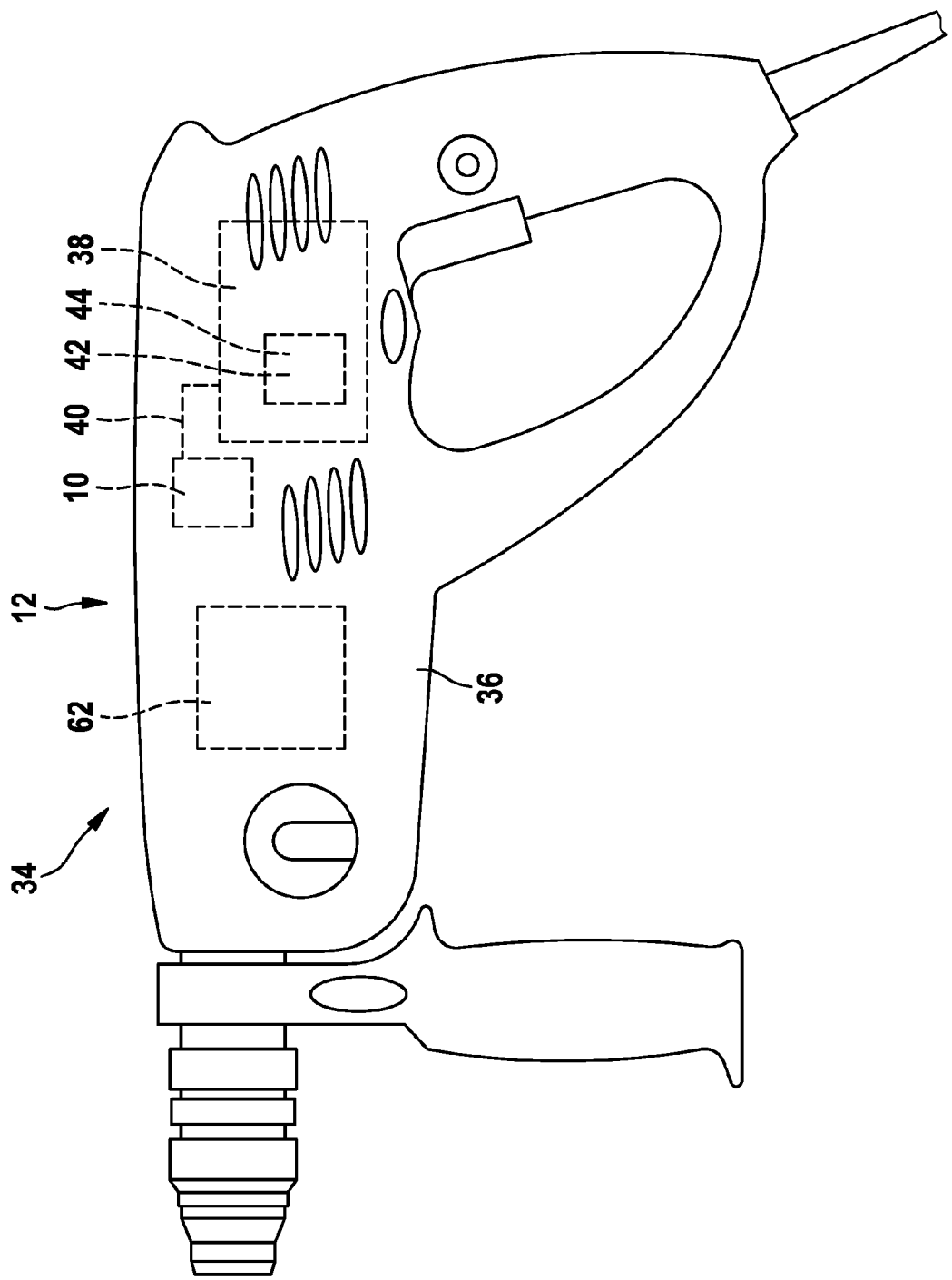

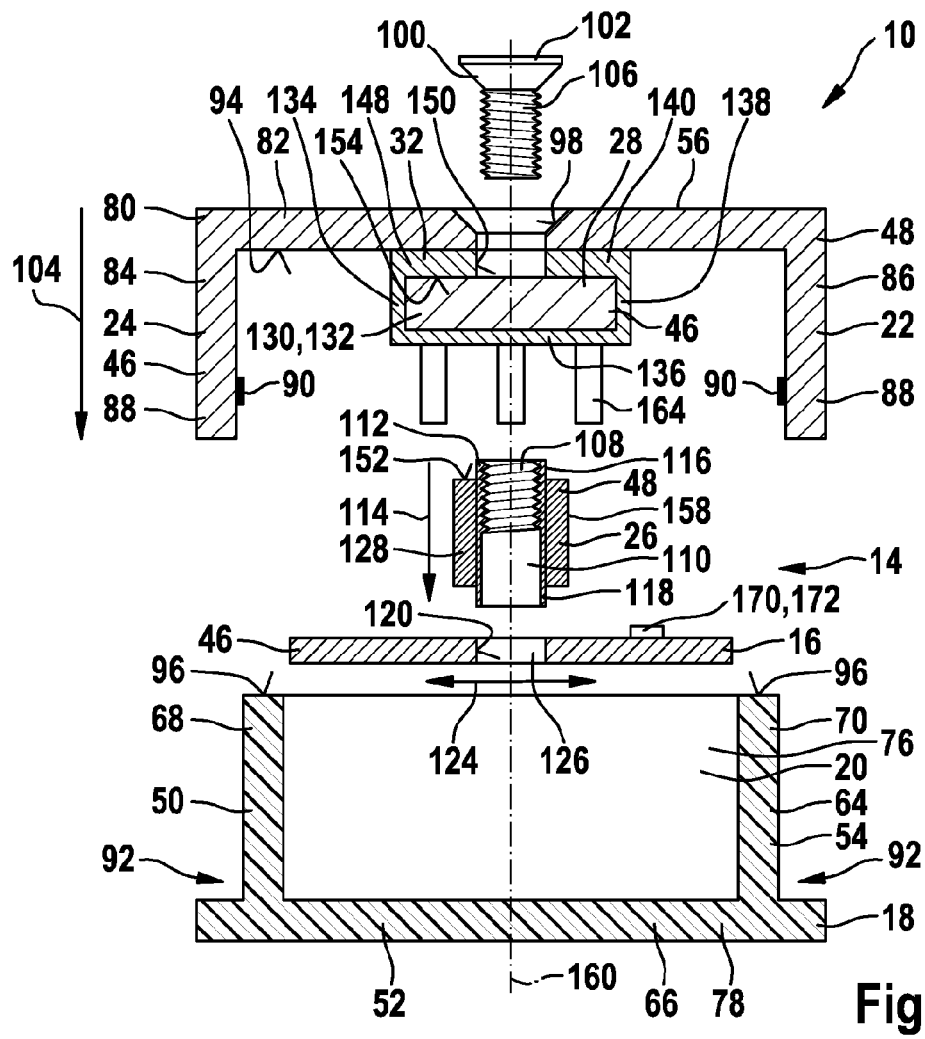
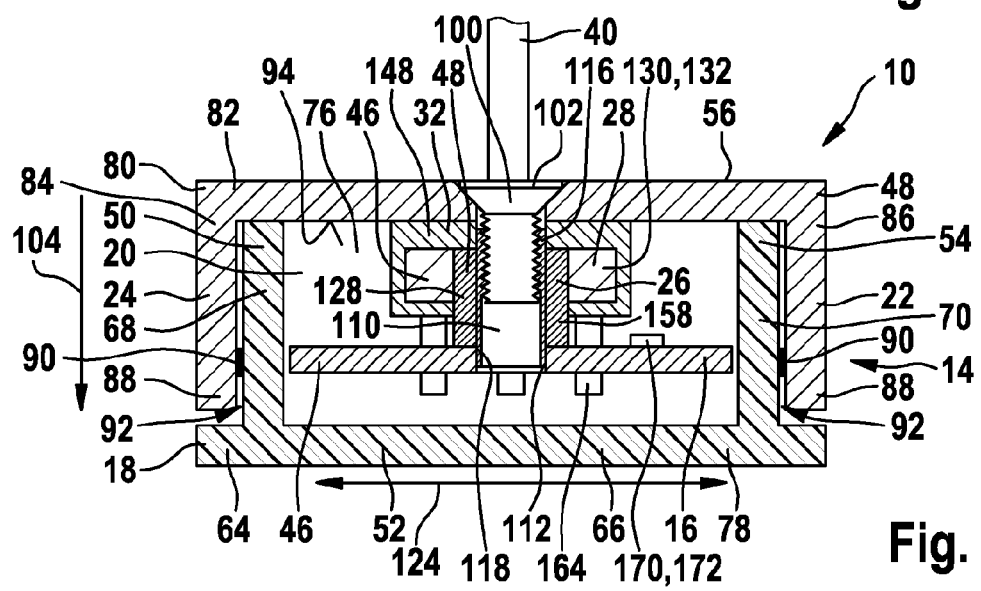

ELECTRONIC MODULE

This application is a 35 U.S.C. §371 National Stage Application of PCT/EP2009/058273, filed Jul. 1, 2009, which claims the benefit of priority to Ser. No. 10 2008 041 366.6, filed Aug. 20, 2008 in Germany, the disclosures of which are incorporated herein by reference in their entirety.

The disclosure relates to an electronic module for a portable power tool.

BACKGROUND

An electronic module, in particular for a portable power tool, which has a housing and a printed circuit board has already been proposed.

SUMMARY

The disclosure sets forth an electronic module, in particular for a portable power tool, having an electronic module housing and having at least one printed circuit board.

The disclosure further sets forth that the at least one printed circuit board is at least partially decoupled relative to at least one housing component of the electronic module housing. In this context, an "electronic module" is to be understood to mean, in particular, a unit which has at least one electronic component, for example a printed circuit board, a diode, a transistor, a capacitor, a negative temperature coefficient thermistor and/or a positive temperature coefficient thermistor, a sensor, a resistor and/or another component which appears to be appropriate to a person skilled in the art and/or which is intended to form an electronic circuit of a further unit of the portable power tool, for example a motor unit. The electronic module is preferably formed by a rotation speed controller and/or is arranged within a portable power tool housing of the portable power tool. However, the connection of another unit which appears to be expedient to a person skilled in the art, for example a lighting unit and/or a valve unit and/or an ignition coil unit etc., would also be possible in principle. In this case, a "printed circuit board" is to be understood to mean, in particular, a printed circuit and/or a support which is composed of insulating material, to which an electrically conductive material is applied and/or which serves for mechanically fastening and/or electrically connecting components, in particular electronic components, by means of an adhesive bonding process and/or a clamping process and/or a welding process and/or, in particular, a soldering process. However, another method for fastening and/or connection would also be feasible in principle. In this case, a "housing component" represents, in particular, a constituent part of the electronic module housing, with the "electronic module housing" of the electronic module in this case defining, in particular, a structure which surrounds all the components of the electronic module completely or at least on six sides and/or the electronic module is formed by other components, for example the motor unit, a gear mechanism unit and/or other components which are arranged within the portable power tool housing, separately and/or differently from a portable power tool housing. In addition, the housing component is intended, in particular, to enclose and/or to mount and/or to support and/or to cool at least one component of the electronic module, where "intended" is to be understood to mean specially equipped and/or designed. In this context, the phrase "at least partially decoupled" is to be understood to mean, in particular, that the printed circuit board is preferably more than 75%, advantageously more than 85% and particularly preferably more than 95% independent of the housing component in at least one respect or in terms of one flow of energy, for example a movement and/or a temperature and/or a flow of power, and/or at least one intermediate element and/or component, for example a further housing component, is physically arranged between the printed circuit board and the housing component. The design according to the disclosure can ensure advantageous, mechanically stress-free mounting or suspension of the printed circuit board in a structurally simple manner.

The disclosure also proposes that the at least one housing component forms at least one accommodation region for the at least one printed circuit board. In this case, an "accommodation region" is to be understood to mean, in particular, a three-dimensional formation, in particular a pot-like formation, which forms a cavity in which at least the printed circuit board is completely accommodated and/or which bounds the cavity on at least two sides, preferably on five sides. Other components of the electronic module can also be accommodated in the accommodation region. The housing component is advantageously formed from plastic and represents a first housing component and/or forms a mounting apparatus for fixing the electronic module to the portable power tool and/or to the motor unit. By virtue of producing the accommodation region, the printed circuit board can be advantageously completely arranged or mounted in the housing component of the electronic module such that it is protected.

The electronic module preferably has at least one cooling apparatus which forms at least one housing component. In this context, a "cooling apparatus" is to be understood to mean, in particular, an apparatus, for example a fan and/or, in particular, a specially designed body, for example in the form of an opening and/or a cooling rib and/or a plate and/or, in particular, a metal U-profile plate, which serves for cooling purposes and/or which is intended to absorb and/or dissipate heat. The cooling apparatus has the shape of an inverted U and represents a second housing component and forms, together with the first housing component, the electronic module housing. Furthermore, the second housing component is arranged between the printed circuit board and the first housing component with respect to a possible flow of power and represents the electrical and/or thermal and/or the moving decoupling of the printed circuit board from the first housing component. The cooling apparatus and primarily the design as a housing component provide, firstly, a compact design and, secondly, optimum and advantageous cooling with a large cooling area and thus reliable operation of the electronic module.

It is also advantageous if the electronic module has at least one spacer which spaces the at least one printed circuit board from the at least one cooling apparatus. A "spacer" is to be understood to mean, in particular, an element which serves to create a physical arrangement which prevents contact between components of the electronic module and, in particular, between the printed circuit board and the cooling apparatus. The spacer is advantageously formed from metal and makes contact with the printed circuit board and the cooling apparatus directly in each case. By virtue of the spacer, the printed circuit board can be arranged at a fixed and exact spacing in relation to the cooling apparatus in a structurally simple manner.

A further aspect of the disclosure sets forth that the at least one printed circuit board is connected to the at least one cooling apparatus by means of the at least one spacer. In this case, all types of connection which appear expedient to a person skilled in the art, such as a force-fitting and/or interlocking and/or cohesive connection, are feasible in principle. A structurally simple connection between the printed circuit board and the cooling apparatus can be achieved by virtue of the design according to the disclosure.

The disclosure also sets forth that at least the at least one spacer is connected to the at least one printed circuit board by means of a press-in process. In this case, a "press-in process" is to be understood to mean, in particular, a process which is based on a cohesive connection and/or by means of which the spacer is connected to the printed circuit board in a non-detachable manner, preferably on an atomic level. The press-in process results in a fixed and invariable position of the printed circuit board relative to the spacer, as a result of which these two components can advantageously be mounted as a compact assembly.

It may also be advantageous if the at least one spacer is connected to the at least one cooling apparatus by means of a force-fitting connection, as a result of which a stable and secure connection of the two components can be created. Furthermore, an encapsulation process, which has been customary to date, to fasten the components of the electronic module, such as the printed circuit board and the cooling apparatus, to one another can be avoided on account of the force-fitting connection, this preventing a disadvantageous change in position of the components in relation to one another.

In addition, the components of the electronic module can be assembled in a structurally simple manner if the at least one spacer is connected to the at least one cooling apparatus by means of a releasable connection. In this context, a "releasable connection" is to be understood to mean a connection, such as a latching connection and/or, in particular, a screw connection, which can be released without causing any loss of function of the components which are connected to one another, or of the spacer and the cooling apparatus.

The releasable connection is advantageously a screw connection which is created by a countersunk screw. The countersunk screw engages in an internal thread which is arranged in a recess in the spacer, as a result of which the spacer and the components arranged on it, for example the printed circuit board, can advantageously be automatically centered.

In addition, the disclosure sets forth that the electronic module has at least one semiconductor having at least one semiconductor housing which has at least one fastening element, with the at least one fastening element being intended to position at least the at least one semiconductor. In this case, a "semiconductor" is to be understood to mean, in particular, a component, such as a diode, a thyristor, a TRIAC, a MOSFET, an IGBT component and/or another component which appears appropriate to a person skilled in the art and which has electrically conductive and electrically non-conductive properties and/or which serves to conduct and/or to switch and/or to control current and/or voltage. The semiconductor is preferably in the form of a TRIAC. In this case, a "semiconductor housing" defines a three-dimensional formation which surrounds the semiconductor completely or on at least six sides. The semiconductor housing is preferably formed by a TO220 housing and, for the purpose of good thermal conductivity, is manufactured from metal. In this case, a "fastening element" preferably represents an element, for example a lug with a cutout, which serves to fasten the semiconductor to another component and/or which is integrally formed with the semiconductor housing, with "integrally" in this case meaning that the fastening element and the semiconductor housing can be produced in a common encapsulation process. In this context, "position" is to be understood to mean, in particular, that exact positioning and/or orientation of the semiconductor is ensured by the fastening element. The semiconductor can provide robust control of the electronic module which can be mounted in a protected manner by means of the semiconductor housing and can be securely positioned and fastened by means of the fastening element.

In a preferred development, the at least one semiconductor is connected to the at least one cooling apparatus by means of a clamping connection which is created by the at least one spacer. In this context, a "clamping connection which is created by the spacer" is to be understood to mean a force-fitting connection which is created by an upper side of the spacer, which upper side is averted from the printed circuit board, being pressed against a surface of the fastening element, which surface faces the printed circuit board, and therefore the semiconductor housing being pressed against a lower side of the cooling apparatus, which lower side points toward the printed circuit board, by means of the fastening element. Therefore, on account of its operative connection to the countersunk screw, the spacer advantageously serves both to save components, costs and expenditure on assembly and additionally as a fastening element for the semiconductor housing or the semiconductor, as a result of which mechanically stress-free fastening of the semiconductor is additionally ensured. The semiconductor also experiences advantageous and efficient cooling on account of its arrangement directly on the cooling apparatus.

The disclosure additionally sets forth that the at least one spacer is intended to form a thermal coupling between at least the at least one semiconductor and the at least one printed circuit board. In this context, a"thermal coupling" is to be understood to mean a coupling or a connection of components which is intended, in particular in a deliberate manner, to conduct heat and/or of which the thermal conductivity is better than 3 $[W/(m*K)]$, preferably better than 10 $[W/(m*K)]$ and particularly preferably better than 15 $[W/(m*K)]$. In this case, the term "semiconductor" also includes the semiconductor housing. A temperature of the semiconductor can be indirectly determined or measured by means of the thermal coupling. To this end, the printed circuit board has a measuring apparatus, such as a negative temperature coefficient thermistor or NTC thermistor, which is preferably formed on the printed circuit board as an SMD component, as a result of which a way of determining a temperature of the semiconductor such that components, costs and outlay on assembly is saved is created.

The disclosure also sets forth that the at least one spacer is intended to center the at least one printed circuit board at least relative to the housing component. In this context, the phrase "to center . . . relative to the housing component" is understood to mean, in particular, that a symmetry of the printed circuit board in relation to a plane of the housing component, which plane extends parallel to the two limbs of the U of the cooling apparatus or of the second housing component, is established with the aid of the spacer or the fastening of said spacer by the countersunk screw. However, an uncentered arrangement would also be feasible in general. On account of being centered, the printed circuit board can be moved to an advantageously predetermined and fixed position relative to the other components of the electronic module, as a result of which, for example, interfaces, such as connection lines or cables, can be fastened to the printed circuit board and also to the first housing component in a simple manner.

A further refinement of the disclosure relates to a portable power tool having at least one electronic module, it being feasible to use the electronic module, in principle, for all portable power tools which appear expedient to a person skilled in the art, and in particular for portable power tools with rotatably driven tools.

BRIEF DESCRIPTION OF THE DRAWINGS

Further advantages can be gathered from the following description of the drawing. The drawing illustrates an exemplary embodiment of the disclosure. The drawing, the description and the claims contain numerous features in combination. A person skilled in the art will also expediently consider the features individually, and combine them to develop further expedient combinations.

In the drawing:

FIG. 1 shows a portable power tool having an electronic module according to the disclosure, FIG. 2 shows the electronic module from FIG. 1 in which it is broken apart into its individual parts, FIG. 3 shows a sectional illustration of the electronic module from FIG. 1 in the assembled state from the front.

DETAILED DESCRIPTION

Figure 4:
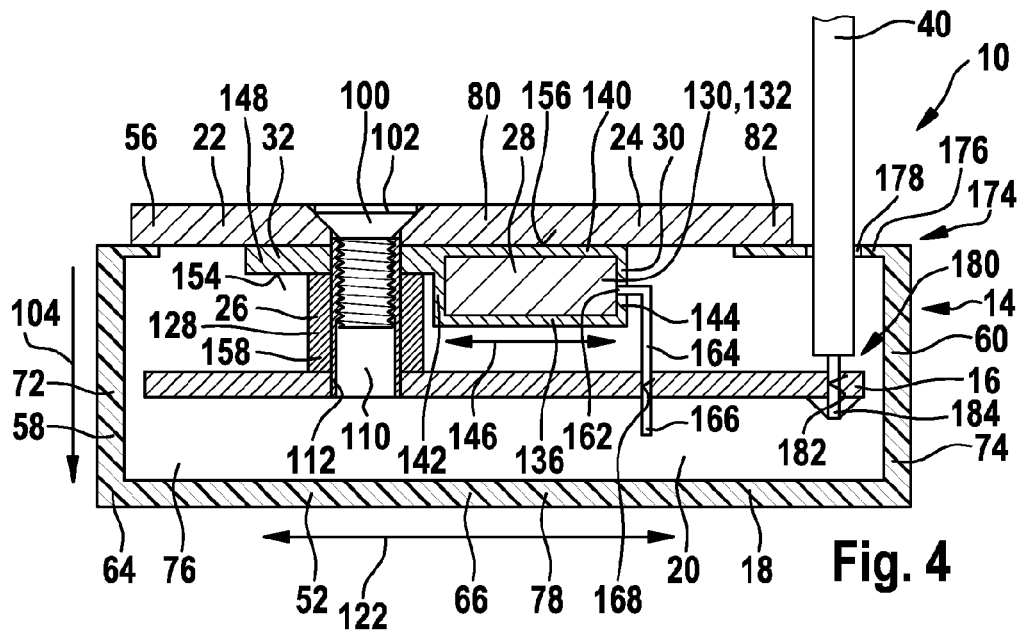
FIG. 4 shows a sectional illustration of the electronic module from FIG. 1 in the assembled state from the side.

FIG. 1 shows a portable power tool 12 in the form of a hammer drill 34 having a portable power tool housing 36, a motor unit 38 and having an electronic module 10 according to the disclosure which is arranged in the portable power tool housing 36 and is connected to the motor unit 38 via electrical lines 40. The electronic module 10 represents a rotation speed controller 42 which controls and regulates a rotation speed of a motor 44 of the motor unit 38.

FIG. 2 shows a detailed illustration of the electronic module 10 broken apart into its individual parts. The electronic module 10 has an electronic module housing 14 which is made up of a first housing component 18 and a second housing component 24, a spacer 26 and a plurality of electronic components 46 in the form of a printed circuit board 16 and of a semiconductor 28. The electronic module 10 also has a cooling apparatus 22 which is formed by the housing component 24. Since the printed circuit board 16 is not directly connected to the first housing component 18 either in relation to a movement or with respect to a flow of temperature, the printed circuit board 16 is at least partially decoupled relative to the housing component 18 of the electronic module housing 14. This decoupling is performed by means of an intermediate element 48 which is formed firstly by the second housing component 24 and secondly by the spacer 26 which spaces the printed circuit board 16 from the cooling apparatus 22.

As can be seen in FIGS. 3 and 4, the electronic module housing 14 surrounds all the components of the electronic module 10, specifically the printed circuit board 16, the spacer 26 and the semiconductor 28, on six sides 50, 52, 54, 56, 58, 60 and thus separates these components 16, 26, 28 from other components, for example the motor unit 38 or a gear mechanism unit 62, which are arranged within the portable power tool housing 36 (see FIG. 1). The first housing component 18 of the electronic module housing 14 forms a pot-like plastic body 64 which, with a base element 66 and with four walls 68, 70, 72, 74 which extend perpendicular to the base element 66 and form a rectangular shape, forms five sides 50, 54, 56, 58, 60 of the electronic module housing 14. The base element 66 and the four walls 68, 70, 72, 74 form a cavity 76, so that the housing component 18 forms an accommodation region 20 for the printed circuit board 16. In addition, the first housing component 18 represents a mounting apparatus 78 which serves to fasten the electronic module 10 to the portable power tool 36 or to the motor unit 38.

The housing component 24 is formed by a metal U-profile plate 80 which has a base 82, which extends parallel to the base element 66, and two limbs 84, 86 which extend perpendicular to the base 82 and parallel to the walls 68, 70. The limbs 84, 86 which run parallel to the walls 68, 70 have, at their end regions 92, latching elements 90 which engage in recesses (not illustrated in any detail here) in the walls 68, 70, which recesses are arranged in regions 92 in the vicinity of the base element 66, in order to connect the housing component to the housing component 18 in a latching manner (see FIG. 3). In addition, the housing component 24 represents the sixth side 52 of the electronic module housing 14, with a lower side 94 of the housing component 24 or of the cooling apparatus 22 resting on a surface 96 of the walls 68, 70 and therefore at least largely closing the accommodation region 20 for the purpose of accommodating the components, such as the printed circuit board 16, which is susceptible to faults, and the semiconductor 28 of the electronic module 10, such that they are protected against contamination.

The cooling apparatus 22 or the base 82 of the housing component 24 has a recess 98 which is arranged centrally between the two limbs 84, 86 and of which the shape is matched to a shape of a countersunk screw and through which a screw 100, in the form of a countersunk screw 102, is passed in a direction 104 which points toward the base element 66 of the housing component 18 in order to connect the spacer 26 to the cooling apparatus 22 by means of a force-fitting connection or a releasable screw connection. To this end, the screw 100 engages by way of its external thread 106 in an internal thread 108 which is formed in a round recess 110 in an inner cylindrical sleeve 112 of the spacer 26, with the recess 110 running through the spacer 26 along a main direction of extent 114 of said spacer. As a result, an end portion 116 which points toward the cooling apparatus 22 projects into the recess 98 of the cooling apparatus 22 and the spacer 26 therefore establishes direct contact with the cooling apparatus 22. An end portion 118 of the spacer 26, which end portion is situated opposite the end portion 116 in the direction of the printed circuit board 16, represents a connection or a direct contact to the printed circuit board 16, as a result of which the printed circuit board 16 is connected to the cooling apparatus 22 by means of the spacer 26. In this case, the spacer 26 or the end portion 118 is connected by means of a press-in process to the printed circuit board 16 or to an edge 120 of a recess 126, which is arranged in the printed circuit board centrally in relation to a direction 124 which is perpendicular to a main direction of extent 122 of the printed circuit board 16 and eccentrically in relation to the main direction of extent 122, or the end portion 118 engages in the recess 126. By virtue of the press-in process, the printed circuit board 16 and the spacer form a compact assembly which can be separated from the cooling apparatus 22 in one working step by loosening the screw 100. Furthermore, the spacer 26 has an outer sleeve 128 which is shorter than the inner sleeve 112 in the main direction of extent 114 of the spacer 26 and is integrally formed with said inner sleeve.

The semiconductor 28 is formed by a power semiconductor 130 in the form of a TRIAC 132 and is surrounded on six sides 134, 136, 138, 140, 142, 144 by a semiconductor housing 30 which is manufactured from metal and represents a TO220 housing. The semiconductor housing 30 also has a fastening element 32 in the form of a lug 148 which extends in a main direction of extent 146 of the semiconductor 28 and has a cutout 150, with the fastening element 32 being intended to position the semiconductor 28, as a result of which the semiconductor 28 extends plane-parallel to the cooling apparatus 22. To this end, the end region 116 of the spacer 26 is passed through the cutout 150 in the lug 148, as a result of which a surface 152, which is averted from the printed circuit board 16, of the spacer 26 or of the outer sleeve 128 is pressed against a lower side 154, which faces the printed circuit board 16, of the fastening element 32 by the screw connection, and therefore the semiconductor housing 30 is pressed against the lower side 94, which points toward the printed circuit board 16, of the cooling apparatus 22 by means of the fastening element 32. As a result, an upper side 156, which is averted from the printed circuit board 16, of the semiconductor housing 30 or the fastening element 32 rests directly or with contact on the lower side 94 of the cooling apparatus 22 which points toward the printed circuit board 16. Therefore, on account of its operative connection to the screw 100, the spacer 26 additionally serves as a fastening element 158 and the semiconductor 28 is connected to the cooling apparatus 22 by means of a clamping connection which is created by the spacer 26. Furthermore, the spacer 26 is intended to center the printed circuit board 16 relative to the housing components 18, 24, as a result of which the printed circuit board 16 is symmetrical in relation to a plane 160 which extends parallel to the two limbs 84, 86 of the U-profile plate 80 of the cooling apparatus 22 or of the second housing component 24.

Recesses 162 through which connection pins 164, which electrically connect the semiconductor 28 to the printed circuit board 16, engage are formed on that side 144 of the semiconductor housing 30 which is averted from the fastening element 32. To this end, ends 166 of the connection pins 164 which point in the direction of the printed circuit board 16 are passed through recesses 168 in the printed circuit board 16 and soldered by way of the edges thereof.

By virtue of the spacer 26 being manufactured from metal, the spacer 26 is intended to form a thermal coupling between the semiconductor 28 and the printed circuit board 16. This thermal coupling can be used to detect a flow of heat from the semiconductor 28 or the semiconductor housing 30 or the fastening element 32, through the spacer 26, to the printed circuit board 16 and thus to indirectly determine the temperature of the semiconductor 28 by means of the temperature of the printed circuit board 16, for which purpose a measuring apparatus 170 in the form of an NTC 172 is arranged in the printed circuit board 16 as an SMD component.

Figure 5:
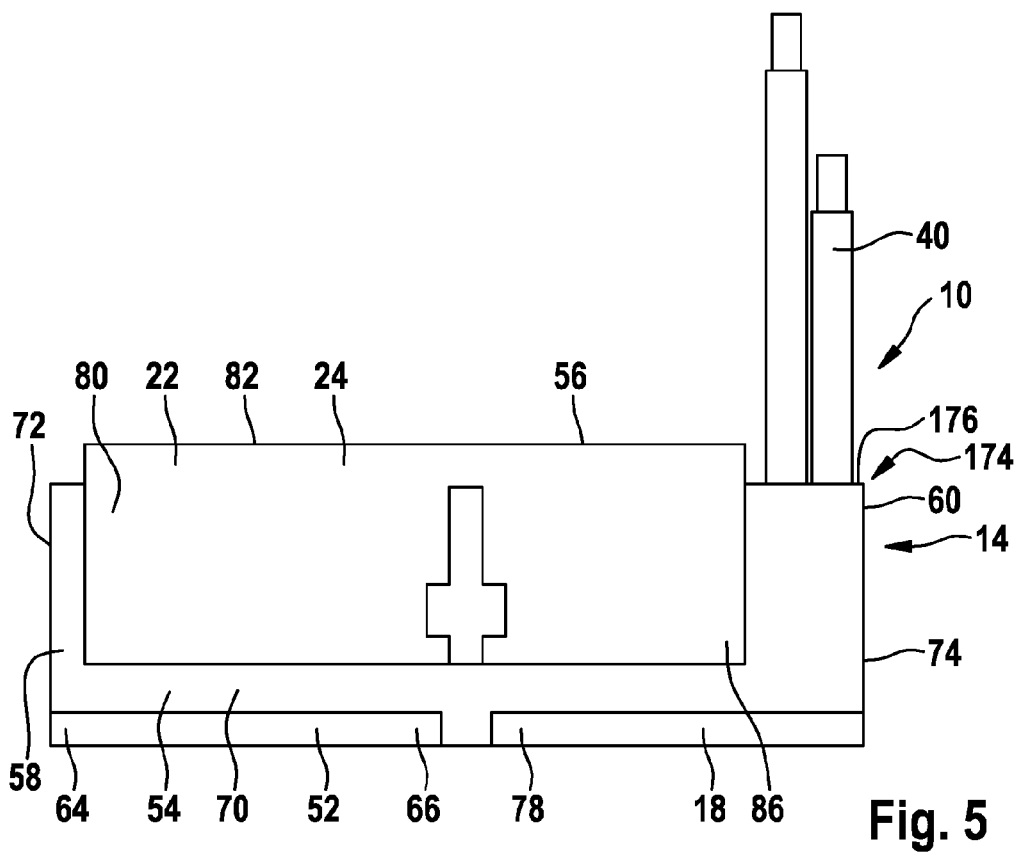
FIG. 5 shows a side view of the electronic module from FIG. 1 in the assembled state.

As can be seen in FIGS. 4 and 5, the electronic module housing 14 has, in the region of the wall 74 of the housing component 18, a region 174, of which the majority is not covered by the housing component 24 or the cooling apparatus 22 and which has a cover 176 which is oriented parallel to the base element 66 and perpendicular to the walls 68, 70, 72, 74. A recess 178 is arranged in the cover 176, the electrical lines 40 of the electronic module 10, of which only an example is shown in FIG. 4, being routed through said recess. For the purpose of making electrical contact with the printed circuit board 16, said printed circuit board has recesses 182 in an end region 180, which points toward the wall 74, of the printed circuit board 16, contact points 184 of the electrical lines 40 being passed through said recesses and being soldered to the printed circuit board 16.

FIG. 5 shows a side view of the electronic module 10 in a closed state, with the arrangement of the housing components 18 and 24 relative to one another being clearly shown here.

The invention claimed is:

1. An electronic module for use in a portable power tool, comprising:
   an electronic module housing having at least one housing component; and
   at least one printed circuit board,
   wherein the at least one printed circuit board is at least partially decoupled relative to the at least one housing component of the electronic module housing,
   wherein the at least one housing component includes at least one cooling apparatus,
   wherein the electronic module further comprises at least one spacer which spaces the at least one printed circuit board from the at least one cooling apparatus,
   wherein the electronic module further comprises at least one semiconductor having at least one semiconductor housing, which has at least one fastening element, with the at least one fastening element configured to position at least the at least one semiconductor, and
   wherein the at least one spacer is configured to form a thermal coupling between at least the at least one semiconductor and the at least one printed circuit board.

2. The electronic module as claimed in claim 1, wherein the at least one housing component forms at least one accommodation region for the at least one printed circuit board.

3. The electronic module as claimed in claim 1, wherein the at least one spacer connects the at least one printed circuit board to the at least one cooling apparatus.

4. The electronic module as claimed in claim 3, wherein the at least one spacer is connected to the at least one printed circuit board via a press-fit connection.

5. The electronic module as claimed in claim 3, wherein the at least one spacer is connected to the at least one cooling apparatus via a force-fitting connection.

6. The electronic module as claimed in claim 5, wherein the at least one spacer is connected to the at least one cooling apparatus via a releasable connection.

7. The electronic module as claimed in claim 1, wherein the at least one semiconductor is connected to the at least one cooling apparatus via a clamping connection which is created by the at least one spacer.

8. An electronic module for use in a portable power tool, comprising:
   an electronic module housing having at least one housing component; and
   at least one printed circuit board,
   wherein the at least one printed circuit board is at least partially decoupled relative to the at least one housing component of the electronic module housing,
   wherein the at least one housing component includes at least one cooling apparatus,
   wherein the electronic module further comprises at least one spacer which spaces the at least one printed circuit board from the at least one cooling apparatus, and
   wherein the at least one spacer is configured to center the at least one printed circuit board at least relative to the housing component.

9. The electronic module as claimed in claim 8, further comprising at least one semiconductor having at least one semiconductor housing, which has at least one fastening element, wherein the at least one fastening element is configured to position at least the at least one semiconductor relative to the at least one housing component.

10. A portable power tool, comprising:
    a tool housing;
    a motor unit located in the tool housing; and
    an electronic module located in the tool housing, said electronic module including (i) an electronic module housing having at least one housing component, and (ii) at least one printed circuit board, wherein the at least one printed circuit board is at least partially decoupled relative to the at least one housing component of the electronic module housing, wherein the at least one housing component includes at least one cooling apparatus, wherein the electronic module further comprises at least one spacer which spaces the at least one printed circuit board from the at least one cooling apparatus, and wherein the electronic module further comprises at least one semiconductor having at least one semiconductor housing, which has at least one fastening element, with the at least one fastening element configured to position at least the at least one semiconductor.

11. The portable power tool as claimed in claim 10, wherein the at least one housing component of the electronic module housing forms at least one accommodation region for the at least one printed circuit board.

12. The portable power tool as claimed in claim 10, wherein the at least one spacer is configured to form a thermal coupling between at least the at least one semiconductor and the at least one printed circuit board.

13. The portable power tool as claimed in claim 10, wherein the at least one semiconductor is connected to the at least one cooling apparatus via a clamping connection which is created by the at least one spacer.

* * * * *